US010935877B2

(12) United States Patent
Tsai et al.

(10) Patent No.: US 10,935,877 B2
(45) Date of Patent: Mar. 2, 2021

(54) PROJECTION APPARATUS AND HEAT DISSIPATION CONTROL METHOD

(71) Applicant: Coretronic Corporation, Hsin-Chu (TW)

(72) Inventors: Te-Ying Tsai, Hsin-Chu (TW); Kun-Chieh Chan, Hsin-Chu (TW)

(73) Assignee: Coretronic Corporation, Hsin-Chu (TW)

(*) Notice: Subject to any disclaimer, the term of this patent is extended or adjusted under 35 U.S.C. 154(b) by 0 days.

(21) Appl. No.: 16/852,550

(22) Filed: Apr. 20, 2020

(65) Prior Publication Data

US 2020/0341355 A1    Oct. 29, 2020

(30) Foreign Application Priority Data

Apr. 29, 2019    (CN) .......................... 201910352362.X

(51) Int. Cl.
*G03B 21/16*        (2006.01)
*G03B 21/20*        (2006.01)
*H01L 35/32*        (2006.01)

(52) U.S. Cl.
CPC .......... *G03B 21/16* (2013.01); *G03B 21/2053* (2013.01); *H01L 35/32* (2013.01)

(58) Field of Classification Search
CPC ............ G05B 15/02; G05B 2219/2642; G05B 19/042; G05B 19/0423; G05B 2219/13; G05B 2219/25022; G05B 2219/25032; G05B 2219/25268; G05B 2223/06; G05B 13/04; G05B 17/02; G05B 2219/25419; G05B 2219/2614; G05B 19/054; G05B 19/416; G05B 2219/1137; G05B 2219/15038; G05B 2219/25168; G05B 2219/37371; G05B 2219/50333; H05B 47/105; H05B 47/19; H05B 47/11; G03B 21/16; G03B 21/204; G03B 21/2053
See application file for complete search history.

(56) References Cited

U.S. PATENT DOCUMENTS

2016/0261425 A1*   9/2016   Horton ............... G05D 23/1917

FOREIGN PATENT DOCUMENTS

CN          108776499          11/2018

* cited by examiner

*Primary Examiner* — Monica C King
(74) *Attorney, Agent, or Firm* — JCIPRNET

(57) ABSTRACT

A projection apparatus and a heat dissipation control method therefor. The projection apparatus includes a light valve module, a light source providing an illumination beam, a brightness sensor sensing a brightness of the illumination beam, a cooling element having a cold end surface dissipating heat from the light valve module and a hot end surface, a humidity sensor sensing an ambient humidity, a first temperature sensor sensing an ambient temperature, a second temperature sensor sensing a cold end temperature, and a controller coupled to the brightness sensor, the humidity sensor, the first temperature sensor, the second temperature sensor, the cooling element, and the light source. The controller determines a specification temperature according to the brightness, calculates a dewpoint temperature according to the ambient temperature and the ambient humidity, and adjusts a first power of the light source according to the dewpoint temperature, the specification temperature and the cold end temperature.

19 Claims, 3 Drawing Sheets

PROJECTION APPARATUS AND HEAT DISSIPATION CONTROL METHOD

CROSS-REFERENCE TO RELATED APPLICATION

This application claims the priority benefit of China application serial no. 201910352362.X, filed on Apr. 29, 2019. The entirety of the above-mentioned patent application is hereby incorporated by reference herein and made a part of this specification.

BACKGROUND

Technical Field

The invention relates to a projection apparatus, and more particularly to a projection apparatus and a heat dissipation control method.

Description of Related Art

With the development of projection technology, projectors have been widely used in homes, offices, schools and other places. As the brightness of the projector becomes higher and higher, heat borne by a light valve element in the projector also increases. In addition, the design of today's projectors is also moving toward trends of slim and light. Traditional passive heat dissipation elements (such as heat sinks, etc.) can be used to dissipate heat with a cooling fan, but it has gradually failed to meet the current heat dissipation needs of the projectors.

In order to enhance the heat dissipation efficiency, a thermoelectric cooler (TEC) has been applied into a heat dissipation system of the projector. The TEC is a semiconductor-based active heat dissipation element. By applying a DC voltage to the TEC, heat is transferred from one end of the TEC to the other end, so that the temperature at one of the ends of the TEC can be lowered and thereby forms a hot end and a cold end. Accordingly, by directly or indirectly contacting the cold end of the TEC with the light valve element, the TEC can take away the heat borne by the light valve element for the purpose of heat dissipation. At the same time, the cold end of the TEC can be cooled to below ambient temperature, and thus can function under conditions that require a negative thermal resistance.

However, when the TEC is used to dissipate the heat from the light valve element, the heat borne by the light valve element may gradually become lower due to a change in brightness, and the TEC may cause a temperature of the cold end to be lower than a dewpoint temperature due to excessively cooling. In this way, once there are water vapors surrounding the TEC, the cold end and the light valve element of the TEC will experience dew condensation. The dew condensation not only reduces the heat dissipation capacity of the TEC, but also may cause damage to electronic components. The use of sealant, waterproof paint and special waterproof structure can block the water vapors, but it may cause the cooling capacity of TEC to decrease while producing difficulty in processing and additional cost.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention provides a projection apparatus and a heat dissipation control method, which can flexibly adjust working powers of a light source and a cooling element based on a brightness provided by the light source, so as to prevent dew condensation on the cooling element and the light valve module from being formed.

Other features and advantages of the invention can be further understood by the technical features disclosed in the invention.

To achieve one, part, or all of the objectives aforementioned or other objectives, an embodiment of the invention provides a projection apparatus including a light valve module, a light source, a brightness sensor, a cooling element, a humidity sensor, a first temperature sensor, a second temperature sensor, and a controller. The light source provides an illumination beam to the light valve module. The brightness sensor is disposed beside a transmission path of the illumination beam and senses a brightness of the illumination beam. The cooling element has a cold end surface and a hot end surface, wherein the cold end surface is configured to dissipate heat from the light valve module. The humidity sensor senses an ambient humidity. The first temperature sensor senses an ambient temperature. The second temperature sensor senses a cold end temperature of the cold end surface. The controller is coupled to the brightness sensor, the humidity sensor, the first temperature sensor, the second temperature sensor, the cooling element, and the light source, wherein the controller determines a specification temperature of the cooling element according to the brightness, and calculates a dewpoint temperature according to the ambient temperature and the ambient humidity. The controller adjusts a first power of the light source according to the dewpoint temperature, the specification temperature and the cold end temperature.

Another embodiment of the invention provides a heat dissipation control method configured to be applied to a projection apparatus including a light source, a light valve module and a cooling element, wherein a cold end surface of the cooling element is configured to dissipate heat from the light valve module. The heat dissipation control method includes: obtaining, by a brightness sensor, a brightness of an illumination beam provided by the light source; determining a specification temperature of the cooling element according to the brightness; sensing an ambient humidity by a humidity sensor, sensing an ambient temperature by a first temperature sensor, and calculating a dewpoint temperature according to the ambient humidity and the ambient temperature; obtaining a cold end temperature of the cold end surface by a second temperature sensor; and adjusting a first power of the light source according to the dewpoint temperature, the specification temperature and the cold end temperature.

In view of the above, the projection apparatus and the heat dissipation control method provided by the invention can be combined with the settings of the temperature sensors and the humidity sensor to control the working powers of the light source and the cooling element according to temperature comparison results. The temperature of the cooling element is controlled above the dewpoint temperature. Therefore, the cooling element and the light valve module do not experience dew condensation. Furthermore, the projection apparatus of the invention can avoid having dew condensation on the cooling element and the light valve module and can maximize the working power of the light source. Thus, the projection apparatus of the invention can simultaneously take into account of the performance and prevent the occurrence of dew condensation. If the working power of the cooling element exceeds that required by the projection apparatus, then the projection apparatus can automatically lower the working power of the cooling element to achieve a power saving effect.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

It is to be understood that other embodiment may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
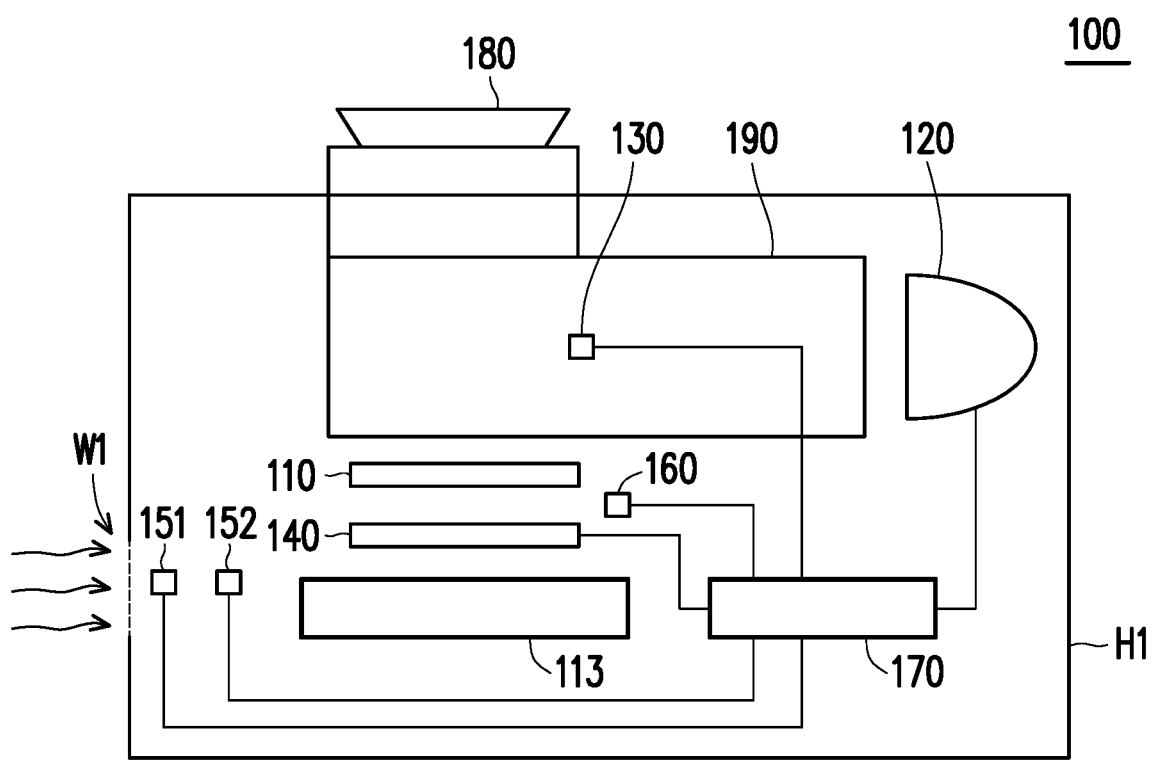
FIG. 1 is a schematic diagram illustrating a projection apparatus according to an embodiment of the invention.

FIG. 1 is a schematic diagram illustrating a projection apparatus 100 according to an embodiment of the invention. Referring to FIG. 1, the projection apparatus 100 of the embodiment includes a light valve module 110, a light source 120, a brightness sensor 130, a cooling element 140, a humidity sensor 152, a first temperature sensor 151, a second temperature sensor 160, a controller 170, a projection lens module 180, an optical engine module 190, and a heat dissipation module 113.

The light source 120 is configured to generate an illumination beam, and the illumination beam is provided to be transmitted to the light valve module 110 through the optical engine module 190. The light source 120 is, for example, a metal halogen lamp, a high-pressure mercury lamp or a solid-state illumination source, such as a light emitting diode, a laser diode or the like.

The optical engine module 190 includes a plurality of optical elements, such as lenses, mirrors, etc., and the optical engine module 190 guides the illumination beam generated by the light source 120 towards the light valve module 110. The light valve module 110 is, for example, a digital micromirror device (DMD) or a liquid crystal on silicon (LCOS), and is configured to covert the illumination beam into an image beam, which is to be projected outwards by the projection lens module 180 to enable the projection apparatus 100 to complete a projection action. The brightness sensor 130 is disposed beside a transmission path of the illumination beam, so as to sense a brightness of the illumination beam generated by the light source 120. More specifically, the brightness sensor 130 can measure the brightness of the illumination beam by sensing a stray light of the illumination beam generated by the light source 120.

Figure 2:
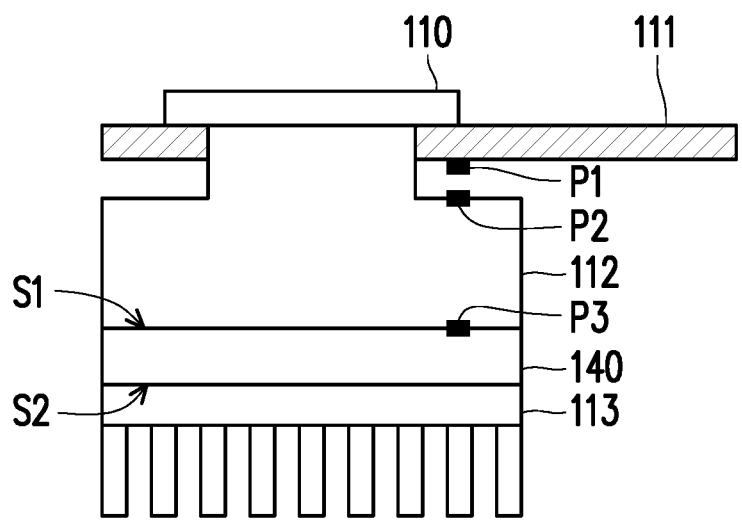
FIG. 2 is a schematic diagram illustrating relationships between a cooling element and a heat dissipation module according to an embodiment of the invention.

The cooling element 140 is an active heat dissipation element, such as a thermoelectric cooler (TEC). A material of the TEC is, for example, a compound of N-type semiconductor and P-type semiconductor or other thermoelectric material. The cooling element 140 has a cold end surface S1 and a hot end surface S2 (as shown in FIG. 2). When the cooling element 140 is electrically conducted, a temperature of the cold end surface S1 is lower than a temperature of the hot end surface S2. The cold end surface S1 of the cooling element 140 is configured to dissipate heat from the light valve module 110 (heat source). Specifically, the cold end surface S1 of the cooling element 140 can be connected to the light valve module 110 in a thermal conduction manner to absorb the heat from the light valve module 110. At least one of a thermal conductive paste and a heat conductive block may be disposed between the cold end surface S1 of the cooling element 140 and the light valve module 110 as a heat transfer medium, but the invention is not limited thereto.

In one of the embodiments, the cooling element 140 can be used together with the heat dissipation module 113 to dissipate the heat from the light valve module 110. The hot end surface S2 of the cooling element 140 can be connected to the heat dissipation module 113 in a thermal conduction manner to conduct the heat to the heat dissipation module 113. In one embodiment, a thermal conductive paste or copper may be disposed between the hot end surface S2 of the cooling element 140 and the heat dissipation module 113 as a heat transfer medium, but the invention is not limited thereto.

FIG. 2 is a schematic diagram illustrating relationships between the cooling element 140 and the heat dissipation module 113 according to an embodiment of the invention. Referring to FIG. 2, the light valve module 110 is disposed on a carrier 111. In the embodiment, a heat conductive block 112 is used as the heat transfer medium between the cold end surface S1 of the cooling element 140 and the light valve module 110, and material of the heat conductive block 112 may, for example, be copper, aluminum or other metal that can achieve heat conduction. One end of the heat conductive block 112 is connected to the light valve module 110 via a through hole of the carrier 111 in a thermal conduction manner. The other end of the heat conductive block 112 is connected to the cold end surface S1 of the cooling element 140 in the thermal conduction manner. The hot end surface S2 of the cooling element 140 is connected to the heat dissipation module 113 (for example, a heat sink fin set) in the thermal conduction manner. As such, the cooling element 140 can conduct the heat from the light valve module 110 to the heat dissipation module 113, thereby dissipating the heat from the light valve module 110. In addition, a thermal conductive paste (not shown) may be added between the heat conductive block 112 and the light valve module 110 to increase the heat conduction effect, and a thermal conductive paste (not shown) may also be added between the heat conductive block 112 and the cold end surface S1 of the cooling element 140 to increase the heat conduction effect, but the invention is not limited thereto. In other embodiments, the cold end surface S1 of the cooling element 140 and the light valve module 110 may not have the heat conductive block 112 therebetween, but may have the thermal conductive paste as the heat transfer medium. The carrier 111 is, for example, a circuit board configured to provide a control signal to the light valve module 110.

The first temperature sensor 151 is configured to sense an ambient temperature, and the humidity sensor 152 is configured to sense an ambient humidity. In one of the embodiments, the projection apparatus 100 includes a housing H1. The housing H1 includes an air inlet W1. The first temperature sensor 151 and the humidity sensor 152 can be adjacent to the air inlet W1. However, in other embodiments, the first temperature sensor 151 and the humidity sensor 152 may be disposed at any positions capable of detecting the ambient temperature and the ambient humidity, such as on a surface of the housing H1, but the invention is not limited thereto. For example, the first temperature sensor 151 and the humidity sensor 152 may be adjacent to the cooling element 140.

The second temperature sensor 160 is configured to sense a cold end temperature of the cold end surface S1 of the cooling element 140. The second temperature sensor 160 can be disposed at any position capable of sensing the cold end temperature of the cold end surface S1. For example, in the embodiment of FIG. 2, the second temperature sensor 160 may be disposed at a position (e.g., position P1) on the carrier 111 and adjacent to the heat conductive block 112. Alternatively, the second temperature sensor 160 may be disposed on the heat conductive block 112 (e.g., position P2). Otherwise, the second temperature sensor 160 may be disposed on the cold end surface S1 (e.g., position 3) or at a position adjacent to the cold end surface S1.

The controller 170 is coupled to the brightness sensor 130, the humidity sensor 152, the first temperature sensor 151, the second temperature sensor 160, the cooling element 140, and the light source 120. The controller 170 is, for example, a central processing unit (CPU), or other programmable micro control unit (MCU) of general purpose or special purpose, a microprocessor, a digital signal processor (DSP), a programmable controller, an application specific integrated circuit (ASIC), a graphics processing unit (GPU), an arithmetic logic unit (ALU) or other similar components, or a combination thereof, but the invention is not limited thereto.

In the embodiment, the controller 170 determines a specification temperature of the cooling element 140 according to the brightness sensed by the brightness sensor 130. The controller 170 calculates a dewpoint temperature according to the ambient temperature sensed by the first temperature sensor 151 and the ambient humidity sensed by the humidity sensor 152. Next, the controller 170 adjusts a working power (hereinafter referred to as "first power") of the light source 120 according to the dewpoint temperature, the specification temperature and the cold end temperature of the cold end surface S1 of the cooling element 140. Further, the controller 170 compares the cold end temperature of the cold end surface S1 and the dewpoint temperature and compares the cold end temperature of the cold end surface S1 and the specification temperature, so as to adjust the first power of the light source 120 according to comparison results of the temperatures, wherein the specification temperature which serves as a temperature upper limit of the cold end temperature is determined according to the brightness of the light source 120.

On the other hand, the controller 170 further adjusts a working power (hereinafter referred to as "second power") of the cooling element 140 according the dewpoint temperature, the specification temperature and the cold end temperature of the cold end surface S1 of the cooling element 140. Furthermore, the controller 170 compares the cold end temperature of the cold end surface S1 and the dewpoint temperature and compares the cold end temperature of the cold end surface S1 and the specification temperature, so as to adjust the second power of the cooling element 140 according to comparison results of the temperatures. As such, the invention can adjust the brightness of the light source 120 and the cooling capacity of the cooling element 140 based on the brightness of the light source 120, the ambient temperature and the ambient humidity, so as to avoid an occurrence of dew condensation on the cooling element 140 and the light valve module 110 in a state of maximizing the brightness of the light source 120.

Figure 3:
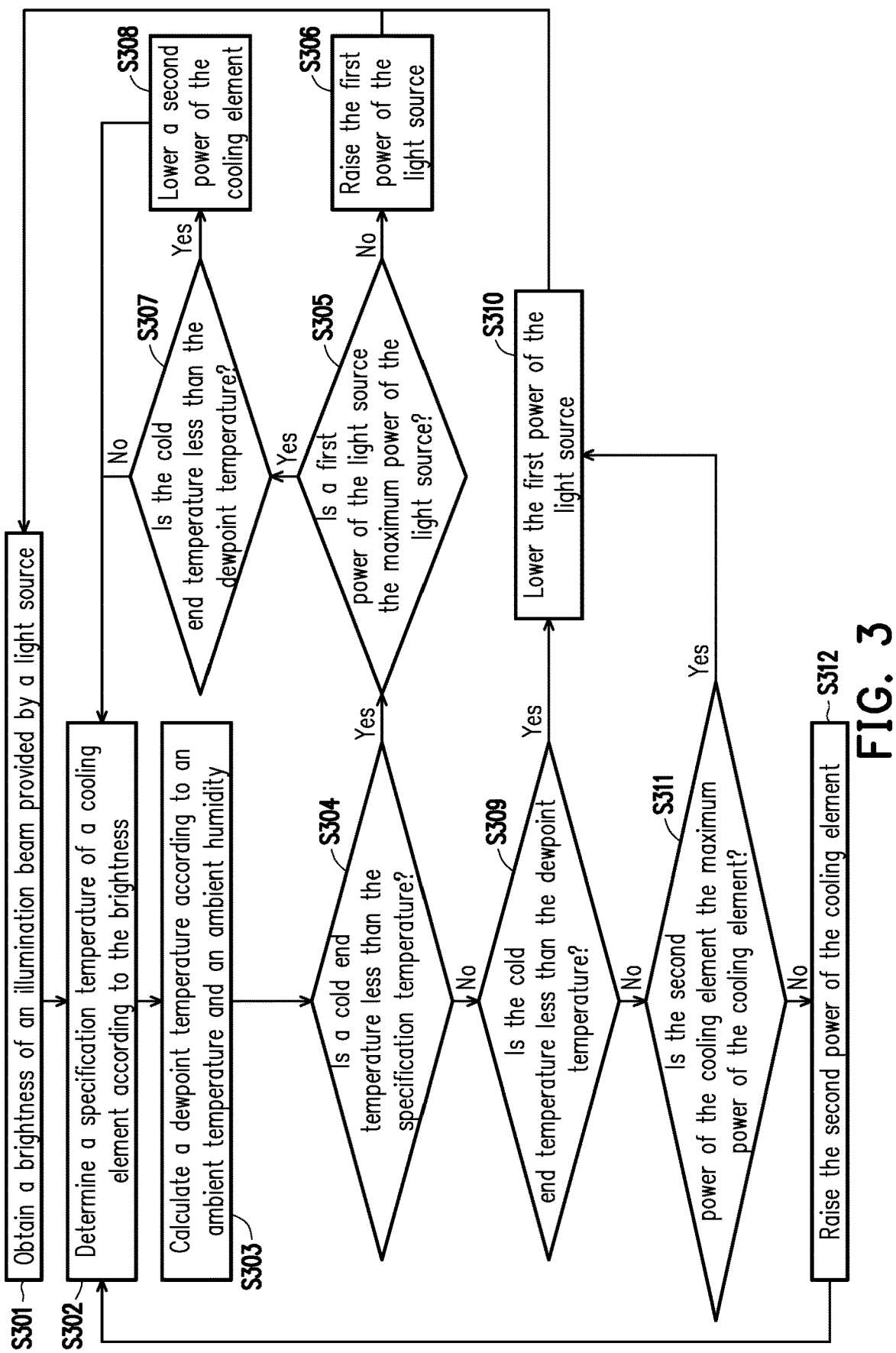
FIG. 3 is a flow chart of a heat dissipation control method illustrated according to an embodiment of the invention.

FIG. 3 is a flow chart of a heat dissipation control method illustrated according to an embodiment of the invention, wherein the heat dissipation control method can be implemented by the various components in the projection apparatus 100 as shown in FIG. 1. Referring to FIG. 1 and FIG. 3 at the same time, detail steps of the heat dissipation control method of the embodiment will be described below in reference to the components of the projection apparatus 100 in FIG. 1.

In step S301, the controller 170 obtains the brightness of the illumination beam provided by the light source 120 through the brightness sensor 130.

In step S302, the controller 170 determines the specification temperature of the cooling element 140 according to the brightness. Specifically, the specification temperature is used to determine whether the cold end temperature of the cold end surface S1 of the cooling element 140 is too high. If the cold end temperature is higher than the specification temperature, then it indicates that the first power of the light source 120 needs to be lowered to lower the brightness of the light source 120 so as to enable the heat borne by the light valve module to be reduced, or indicates that the second power of the cooling element 140 needs to be raised to lower the cold end temperature so as to enhance the heat dissipation capacity. It is to be noted that, a temperature of the light valve module 110 increases as the brightness increases, and thus an amount of the heat needs to be dissipated by the cooling element 140 also rises with the increase of the brightness. Conversely, when the light source 120 provides the illumination beam with a lower brightness, the amount of heat needs to be dissipated by the cooling element 140 is also relatively reduced. Accordingly, it can be known that the cooling capacity required by the cooling element 140 to dissipate the heat from the light valve module 110 is related to the brightness of the light source 120. Thus, in the embodiment, the controller 170 determines the specification temperature of the corresponding cooling element 140 according to the brightness of the light source 120, whereby the specification temperature of the cooling element 140 can vary with the brightness.

It is to be explained that, the controller 170 determines the specification temperature according to a tendency that the specification temperature decreases as the brightness of the light source 120 increases. For instance, Table 1 shows examples of the specification temperature and the brightness. It is to be noted that, the numerical values in the examples of Table 1 are merely examples. In practice, the numerical values may change due to variations in factors such as the material of the light valve module 110, the material of the cold end surface S1 of the cooling element 140, the positions of the brightness sensor 130 and the second temperature sensor 160 and the like.

TABLE 1

| Brightness (lumen) | Specification temperature (° C.) |
|---|---|
| 12000 | 39 |
| 15000 | 35 |
| 18000 | 31 |
| 21000 | 27 |
| 24000 | 23 |
| 27000 | 20 |
| 30000 | 16 |

Figure 4:
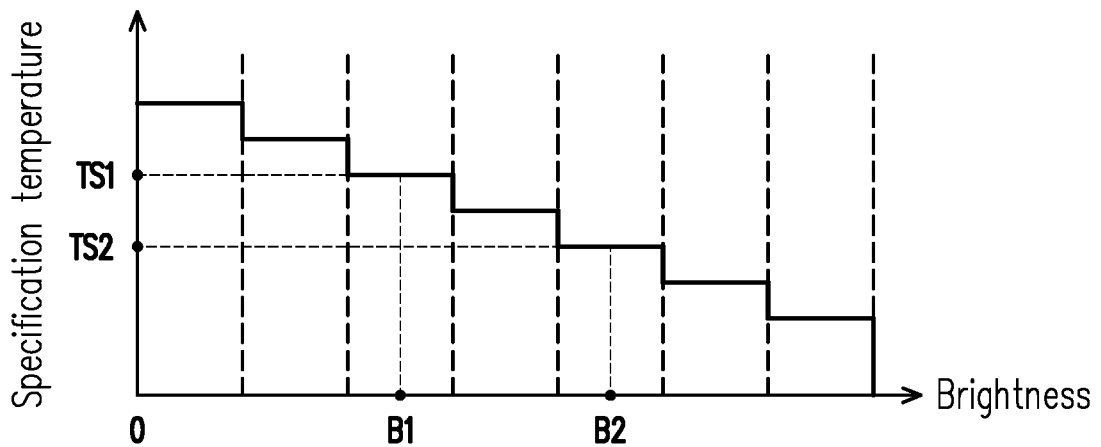
FIG. 4 is a schematic diagram illustrating a relationship between specification temperature and brightness according to an embodiment of the invention.

For another example, FIG. 4 is a schematic diagram illustrating a relationship between the specification temperature and the brightness according to an embodiment of the invention. Referring to FIG. 4, different brightness intervals correspond to different specification temperatures. The controller 170 can determine in which brightness interval the brightness sensed by the brightness sensor 130 falls to determine a corresponding specification temperature. In the example of FIG. 4, when the brightness sensed by the brightness sensor 130 is a first brightness value B1, the controller 170 may determine that the specification temperature is a first temperature value TS1. When the brightness sensed by the brightness sensor 130 is a second brightness value B2 greater than the first brightness value B1, the controller 170 may determine that the specification temperature is a second temperature value TS2 less than the first temperature value TS1. However, Table 1 and FIG. 4 are merely examples for illustration, and are not intended for limiting the invention.

Returning to the flow chart of FIG. 3, in step S303, the controller 170 calculates the dewpoint temperature according to the ambient temperature and the ambient humidity. The ambient temperature may be obtained by the controller 170 through using the first temperature sensor 151, and the ambient humidity may be obtained by the controller 170 through using the humidity sensor 152. The dewpoint temperature is a temperature to which gaseous water in the air needs to be cooled for condensing into liquid water. Furthermore, after the ambient temperature and the ambient humidity are obtained, a dewpoint temperature corresponding thereto can be obtained by searching through a Psychrometric Chart known to those skilled in the art. For instance, when the ambient temperature is 35° C. and the ambient humidity (referred to as relative humidity) is 80%, it can be known by searching the chart that the dewpoint temperature is 31° C.; and when the ambient temperature is 35° C. and the ambient humidity (referred to as relative humidity) is 40%, it can be known by searching through the chart that the dewpoint temperature is 19° C.

In step S304, the controller 170 determines whether the cold end temperature is less than the specification temperature. The cold end temperature is a temperature of the cold end surface S1 obtained by the controller 170 from the second temperature sensor 160. Specifically, if the cold end temperature is less than the specification temperature, then it indicates the specification temperature can be lowered, and according to the relationship between the specification temperature and the brightness as presented in the Table 1, the brightness of the illumination beam of the light source 120 can be raised. Thus, the controller 170 can raise the first power of the light source 120 to increase the brightness of the illumination beam of the light source 120. On the other hand, the cold end temperature being less than the specification temperature also indicates that the cold end temperature can be raised. Therefore, the controller 170 can lower the second power of the cooling element 140 to increase the cold end temperature.

If the controller 170 in the step S304 determines that the cold end temperature is less than the specification temperature, then in step S305, the controller 170 determine whether the first power of the light source 120 is the maximum power of the light source 120. If the controller 170 in the step S305 determines that the first power of the light source 120 is not the maximum power of the light source 120, then in step S306, the controller 170 raises the first power of the light source 120. Next, the process flow returns to the step S301. Specifically, if the cold end temperature is less than the specification temperature and the first power of the light source 120 is not the maximum power of the light source 120, then it indicates that the first power of the light source 120 can be raised without causing dew condensation on the cooling element 140 and the light valve module 110. Therefore, the controller 170 can raise the first power of the light source 120 to increase the brightness of the light source 120. It is worth noted that, since the brightness of the light source 120 has been changed in the step S306, the controller 170 needs to execute the step S301 again to obtain an updated brightness of the light source 120 through the brightness sensor 130.

If the controller 170 in the step S305 determines that the first power of the light source 120 is the maximum power of the light source 120, then in step S307, the controller 170 determines whether the cold end temperature is less than the dewpoint temperature. If the controller 170 in the step S307 determines that the cold end temperature is less than the dewpoint temperature, then in step S308, the controller 170 can lower the second power of the cooling element 140 to save power. If the controller 170 in the step S307 determines that the cold end temperature is greater than or equal to the dewpoint temperature, then the process flow returns to the step S302. Specifically, when the first power of the light source 120 is already the maximum power, if the cold end temperature is less than the dewpoint temperature, then it indicates that the controller 170 is unable to cause the light valve module 110 to increase the cold end temperature in a thermal conduction manner by raising the first power of the light source 120. Thus, the controller 170 can lower the second power of the cooling element 140 to reduce the heat dissipation capacity of the cooling element 140 and increase the cold end temperature, thereby causing the cold end temperature to be greater than the dewpoint temperature and preventing an occurrence of dew condensation on the cooling element 140 and the light valve module 110.

If the controller 170 in the step S304 determines that the cold end temperature is greater than or equal to the specification temperature, then in step S309, the controller 170 determines whether the cold end temperature is less than the dewpoint temperature. If the controller 170 in the step S309 determines that the cold end temperature is less than the dewpoint temperature, then in step S310, the controller 170 lowers the first power of the light source 120. Next, the process flow returns to the step S301. Specifically, if the cold end temperature is greater than or equal to the specification temperature, then it indicates that the heat dissipation capacity of the cooling element 140 is insufficient to cope with the current brightness. On the other hand, if the cold end temperature is less than the dewpoint temperature, then it indicates that dew condensation will occur on the cooling element 140, so the second power of the cooling element 140 should not be raised anymore. Under the condition that the second power of the cooling element 140 cannot be raised, the controller 170 can lower the brightness by means of lowering the first power of the light source 120, and thereby increase the specification temperature.

If the controller 170 in the step S309 determines that the cold end temperature is greater than or equal to the dewpoint temperature, then in step S311, the controller 170 determines whether the second power of the cooling element 140 is the maximum power of the cooling element 140. If the controller 170 in the step S311 determines that the second power of the cooling element 140 is not the maximum power of the cooling element 140, the in step S312, the controller 170 raises the second power of the cooling element 140. Next, the process flow returns to the step S302. Specifically, if the cold end temperature is greater than or equal to the dewpoint temperature and the second power of the cooling element 140 is not the maximum power of the cooling element 140, then it indicates that the second power of the cooling element 140 can be raised without causing dew condensation on the cooling element 140 and the light valve module 110. Therefore, the controller 170 can raise the second power of the cooling element 140 to lower the cold end temperature.

If the controller 170 in the step S311 determines that the second power of the cooling element 140 is the maximum power of the cooling element 140, then in the step S310, the controller 170 lowers the first power of the light source 120. Next, the process flow returns to the step S301. Specifically, if the cold end temperature is greater than or equal to the specification temperature, then it indicates the heat dissipation capacity of the cooling element 140 is insufficient to cope with the current brightness. On the other hand, if the second power of the cooling element 140 is already the maximum power, then it indicates that the controller 170 is unable to lower the cold end temperature by raising the second power of the cooling element 140. Thus, the controller 170 can lower the first power of the light source 120 to lower the brightness, and thereby increase the specification temperature. The increase of the specification temperature indicates a decrease in the demand for the heat dissipation capability of the light valve module 110.

Figure 5:
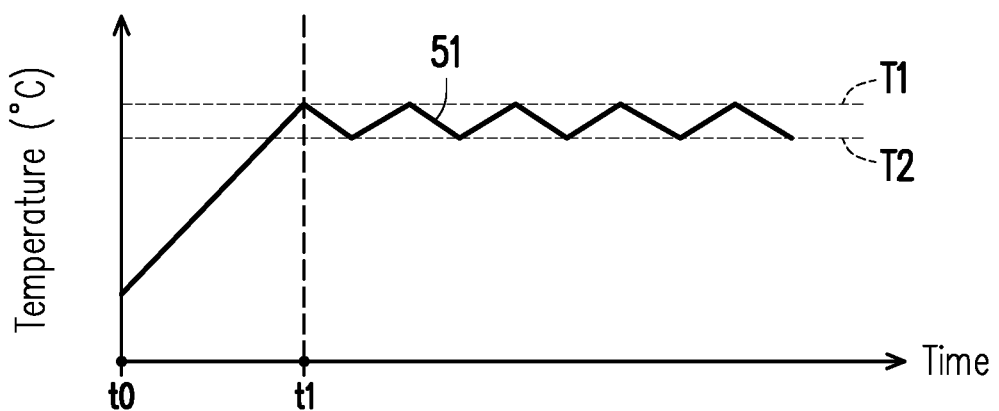
FIG. 5 is a schematic temperature diagram of the cooling element illustrated according to an embodiment of the invention.

FIG. 5 is a schematic temperature diagram of the cooling element 140 illustrated according to an embodiment of the invention. Referring to FIG. 5, a curve S1 represents changes in the cold end temperature of the cooling element 140. At time t0, the projection apparatus 100 is activated. During times t0 to t1, the cooling element 140 is not yet activated;

as an operating time of the projection apparatus 100 increases, the cold end temperature of the cooling element 140 will gradually rise due to the illumination of the illumination beam. At time t1, when the cold end temperature rises to the specification temperature T1, it indicates that the temperature of the light valve module 110 which is connected to the cold end surface S1 of the cooling element 140 in the thermal conduction manner also rises to the specification temperature T1. In a state where the cooling element 140 is not yet activated, in response to the controller 170 determining that the cold end temperature reaches the specification temperature T1, the controller 170 activates the cooling element 140 to dissipate the heat from the light valve module 110. After the cooling element 140 is activated, the controller 17 can control the cold end surface temperature of the cooling element 140 to be above the dewpoint temperature T2 by adjusting the first power of the light source 120 or the second power of the cooling element 140, so that dew condensation does not occur on the cooling element 140 and the light valve module 110.

In summary, the projection apparatus and the heat dissipation control method provided by the invention can be combined with the settings of the temperature sensors and the humidity sensor to control the working powers of the light source and the cooling element according to the temperature comparison results. The temperature of the cooling element is controlled above the dewpoint temperature. Therefore, the cooling element and the light valve module do not experience dew condensation. Furthermore, the projection apparatus of the invention can avoid having dew condensation on the cooling element and the light valve module and can maximize the working power of the light source. Thus, the projection apparatus of the invention can simultaneously take into account of the performance and prevent the occurrence of dew condensation. If the working power of the cooling element exceeds that required by the projection apparatus, then the projection apparatus can automatically lower the working power of the cooling element to achieve the power saving effect.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A projection apparatus, comprising:
   a light valve module;
   a light source, providing an illumination beam to the light valve module;
   a brightness sensor, disposed beside a transmission path of the illumination beam and configured to sense a brightness of the illumination beam;
   a cooling element, having a cold end surface and a hot end surface, wherein the cold end surface is configured to dissipate heat from the light valve module;
   a humidity sensor, configured to sense an ambient humidity;
   a first temperature sensor, configured to sense an ambient temperature;
   a second temperature sensor, configured to sense a cold end temperature of the cold end surface; and
   a controller, coupled to the brightness sensor, the humidity sensor, the first temperature sensor, the second temperature sensor, the cooling element and the light source, wherein the controller determines a specification temperature of the cooling element according to the brightness, and calculates a dewpoint temperature according to the ambient temperature and the ambient humidity,
   wherein the controller adjusts a first power of the light source according to the dewpoint temperature, the specification temperature and the cold end temperature.

2. The projection apparatus according to claim 1, wherein the controller adjusts a second power of the cooling element according to the dewpoint temperature, the specification temperature and the cold end temperature.

3. The projection apparatus according to claim 1, wherein when the brightness is a first brightness, the controller determines that the specification temperature is a first temperature value, and when the brightness is a second brightness greater than the first brightness, the controller determines that the specification temperature is a second temperature value less than the first temperature value.

4. The projection apparatus according to claim 2, wherein when the cold end temperature is less than the specification temperature, the controller executes one of: raising the first power of the light source and lowering the second power of the cooling element.

5. The projection apparatus according to claim 4, wherein when the cold end temperature is less than the dewpoint temperature, the controller lowers the second power of the cooling element.

6. The projection apparatus according to claim 2, wherein when the cold end temperature is greater than the specification temperature, the controller executes one of: raising the second power of the cooling element and lowering the first power of the light source.

7. The projection apparatus according to claim 6, wherein when the cold end temperature is less than the dewpoint temperature, the controller lowers the first power of the light source.

8. The projection apparatus according to claim 1 further comprising:
   a housing, comprising an air inlet, and wherein the humidity sensor and the first temperature sensor are adjacent to the air inlet.

9. The projection apparatus according to claim 1, wherein the humidity sensor and the first temperature sensor are adjacent to the cooling element.

10. The projection apparatus according to claim 1, wherein the cold end surface of the cooling element is connected to the light valve module in a thermal conduction manner, and the hot end surface of the cooling element is connected to the heat dissipation module in a thermal conduction manner.

11. The projection apparatus according to claim 1, wherein in a state where the cooling element is not yet activated, the controller activates the cooling element to dissipate the heat from the light valve module after the controller determines that the cold end temperature is raised to the specification temperature.

12. A heat dissipation control method, configured to be applied to a projection apparatus comprising a light source, a light valve module and a cooling element, wherein a cold end surface of the cooling element is configured to dissipate heat from the light valve module, and the heat dissipation control method comprises:
   obtaining, by a brightness sensor, a brightness of an illumination beam provided by the light source;
   determining a specification temperature of the cooling element according to the brightness;
   sensing an ambient humidity by a humidity sensor, sensing an ambient temperature by a first temperature sensor, and calculating a dewpoint temperature according to the ambient humidity and the ambient temperature;
   obtaining a cold end temperature of the cold end surface by a second temperature sensor; and
   adjusting a first power of the light source according to the dewpoint temperature, the specification temperature and the cold end temperature.

13. The heat dissipation control method according to claim 12 further comprising:
   adjusting a second power of the cooling element according to the dewpoint temperature, the specification temperature and the cold end temperature.

14. The heat dissipation control method according to claim 12, wherein the step of determining the specification temperature of the cooling element according to the brightness comprises:
   determining that the specification temperature is a first temperature value when the brightness is a first brightness; and
   determining that the specification temperature is a second temperature value less than the first temperature value when the brightness is a second brightness greater than the first brightness.

15. The heat dissipation control method according to claim 13, wherein the step of adjusting the first power of the light source according to the dewpoint temperature, the specification temperature and the cold end temperature comprises:
   executing one of raising the first power of the light source and lowering the second power of the cooling element when the cold end temperature is less than the specification temperature.

16. The heat dissipation control method according to claim 15, wherein the step of executing one of raising the first power of the light source and lowering the second power of the cooling element when the cold end temperature is less than the specification temperature comprises:

lowering the second power of the cooling element when the cold end temperature is less than the dewpoint temperature.

17. The heat dissipation control method according to claim 13, wherein the step of adjusting the second power of the cooling element according to the dewpoint temperature, the specification temperature and the cold end temperature comprises:

executing one of raising the second power of the cooling element and lowering the first power of the light source when the cold end temperature is greater than the specification temperature.

18. The heat dissipation control method according to claim 17, wherein the step of executing one of raising the second power of the cooling element and lowering the first power of the light source when the cold end temperature is greater than the specification temperature comprises:

lowering the first power of the light source when the cold end temperature is less than the dewpoint temperature.

19. The heat dissipation control method according to claim 12 further comprising:

in a state where the cooling element is not yet activated, activating the cooling element to dissipate the heat from the light valve module in response to the cold end temperature being raised to specification temperature.

\* \* \* \* \*